(12) United States Patent
Shen et al.

(10) Patent No.: US 12,219,713 B1
(45) Date of Patent: Feb. 4, 2025

(54) PCB ARRANGEMENT AND WIRING STRUCTURE OF LED LAMP BEADS

(71) Applicant: Shenzhen HSG Electronics Co., LTD, Shenzhen (CN)

(72) Inventors: Wei Shen, Shenzhen (CN); Bo Guan, Shenzhen (CN); Zongze Ye, Shenzhen (CN)

(73) Assignee: Shenzhen HSG Electronics Co., LTD, Shenzhen (CN)

( * ) Notice: Subject to any disclaimer, the term of this patent is extended or adjusted under 35 U.S.C. 154(b) by 0 days.

(21) Appl. No.: 18/764,693

(22) Filed: Jul. 5, 2024

(30) Foreign Application Priority Data

Jun. 11, 2024 (CN) .......................... 202410741281.X

(51) Int. Cl.
*H05K 1/02* (2006.01)
*H05K 1/18* (2006.01)

(52) U.S. Cl.
CPC .......... *H05K 1/181* (2013.01); *H05K 1/0296* (2013.01); *H05K 2201/10106* (2013.01); *H05K 2201/10287* (2013.01); *H05K 2201/10318* (2013.01)

(58) Field of Classification Search
CPC ................ H05K 1/181; H05K 1/0296; H05K 2201/10106; H05K 2201/10287; H05K 2201/10318
See application file for complete search history.

(56) References Cited

U.S. PATENT DOCUMENTS

| | | | | |
|---|---|---|---|---|
| 2009/0294782 A1* | 12/2009 | Peng | ..................... | H01L 25/167 257/89 |
| 2024/0231152 A1* | 7/2024 | Du | .......................... | G09G 3/20 |

* cited by examiner

*Primary Examiner* — Sherman Ng
(74) *Attorney, Agent, or Firm* — JEEN IP LAW, LLC

(57) ABSTRACT

Disclosed is a PCB arrangement and wiring structure of LED lamp beads, including a carrier board, and a VDD pin, a DIN pin, and a VSS pin are further arranged in the LED lamp bead installation area; similar pins are connected and wired in parallel with each other, and all the VSS pins are connected and wired in parallel with each other, so that the voltage between each set of lamp beads remains consistent; all the DIN pins are connected and wired in parallel with each other; and the carrier board is further provided with at least one set of VDD power input pin terminals, VSS power input pin terminals, and DIN control terminals, a plurality of the VDD pins are electrically connected to the VDD power input pin terminal, and a plurality of the VSS pins are electrically connected to the VDD power input pin terminal.

10 Claims, 6 Drawing Sheets

PCB ARRANGEMENT AND WIRING STRUCTURE OF LED LAMP BEADS

CROSS-REFERENCE TO RELATED APPLICATIONS

This application claims priority to Chinese Patent Application No. 202410741281.X, filed on Jun. 11, 2024, which is hereby incorporated by reference in its entirety.

TECHNICAL FIELD

The present disclosure belongs to the technical field of LED lamp beads, and particularly relates to a printed circuit board (PCB) arrangement and wiring structure of LED lamp beads.

BACKGROUND

DIN pins, DOUT pins, VDD pins, and VSS pins need to be used for installation of conventional LED lamp beads. When all the LED lamp beads are connected in series, signal data of the LED lamp beads need to be transmitted from one LED lamp bead to the next LED lamp bead, that is, when one LED lamp bead fails, all the other LED lamp beads cannot work, and almost all the LED lamp beads are in a working state. Because power consumption of the LED lamp beads is always high, an overall service life of the entire LED lamp product is shortened. In particular, existing LED products become increasingly miniaturized, and a spacing between LED lamp beads is further narrowed, thereby increasing the difficulty of heat dissipation. Further, pins are more densely distributed, so that an area of electrical connection between every two pins becomes increasingly smaller, thereby causing the increasing electrical connection difficulty and process requirements. Therefore, there is an urgent need for a new printed circuit board (PCB) arrangement and wiring structure of LED lamp beads.

SUMMARY

In order to solve the above technical problems, the present disclosure provides a printed circuit board (PCB) arrangement and wiring structure of LED lamp beads, to solve the problem that when one of the LED lamp beads is damaged, the entire LED lamp product will not light up, and almost all the LED lamp beads are in a working state, thereby shortening an overall service life of the entire LED lamp product.

In a first aspect, a PCB arrangement and wiring structure of LED lamp beads is provided in an embodiment of the present disclosure,
including a carrier board, where at least one set of LED lamp bead installation area is arranged on the carrier board, at least one set of the LED lamp bead installation area is in a matrix form, the installation area includes a plurality of sets of pins, and each set of the pins includes a VDD pin, a DIN pin, and a VSS pin;
all the VDD pins are connected and wired in parallel with each other, and all the VSS pins are connected and wired in parallel with each other, so that the voltage between each set of lamp beads remains consistent;
all the DIN pins are connected and wired in parallel with each other, so that the working state of each lamp bead can be separately controlled;
the carrier board is further provided with at least one set of VDD power input pin terminals, VSS power input pin terminals, and DIN control terminals, a plurality of the VDD pins are electrically connected to the VDD power input pin terminal, a plurality of the VSS pins are electrically connected to the VDD power input pin terminal, and a plurality of the DIN pins are electrically connected to the DIN control terminal; and
the VDD power input pin terminal, the VSS power input pin terminal, and the DIN control terminal are arranged on a side or a back face of the LED lamp bead installation area.

As a possible implementation, the LED lamp bead installation area is configured for installing LED lamp bead sets; and each LED lamp bead set includes a plurality of LED lamp beads; and each LED lamp bead is electrically connected to one VDD pin, one DIN pin, and one VSS pin.

As a possible implementation, a shared power line VDD is drawn from each of the VDD power input pin terminals, a shared signal input line DIN is drawn from each of the DIN control terminals, and a shared ground line VSS is drawn from each of the VSS power input pin terminals; and the VDD pins of each LED lamp bead are electrically connected to the shared power line VDD respectively in a corresponding manner; the DIN pins of each LED lamp bead are respectively connected to the shared signal input line DIN respectively in a corresponding manner; and the VSS pins of each LED lamp bead are electrically connected to the shared ground line VSS respectively in a corresponding manner.

As a possible implementation, the VDD power input pin terminal is electrically connected to a positive electrode of the power supply;
the DIN control terminal is connected to the controller; and
the VSS power input pin terminal is electrically connected to a negative electrode of the power supply.

As a possible implementation, the shared power line VDD, the shared signal input line DIN, and the shared ground line VSS are laid along a length direction of the carrier board, and the LED lamp beads are arranged along directions of the shared power line VDD, the shared signal input line DIN and the shared ground line VSS at an equal interval.

As a possible implementation, the VDD power input pin terminal, the DIN control terminal, and the VSS power input pin terminal are located at an end of the carrier board and spaced apart from each other along a width direction of the carrier board.

As a possible implementation, a positive electrode bonding pad of power supply and a negative electrode bonding pad of power supply are arranged on a side of the carrier board, and configured for electrically connecting the power supply to the carrier board.

As a possible implementation, a wiring length and width of each of the shared power lines VDD, the shared signal input lines DIN, and the shared ground lines VSS are set according to the size of the carrier board, and the lamp beads are located in an area between any two of the shared power line VDD, the shared signal input line DIN, and the shared ground line VSS.

As a possible implementation, the carrier board is a PCB circuit board.

As a possible implementation, each LED lamp bead is provided with an IC control chip and a plurality of monochromatic light-emitting units, the IC control chip stores a unique address code of each LED lamp bead, the IC control chip is connected to a positive electrode and a negative electrode of the power supply respectively through a VDD pin and a VSS pin, the IC control chip is connected to the controller through a DIN pin, and the plurality of monochromatic light-emitting units are connected to the positive electrode of the power supply through VDD pins; and the plurality of monochromatic light-emitting units include a R light-emitting unit, a G light-emitting unit, and a B light-emitting unit, and the plurality of monochromatic light-emitting units are all electrically connected to the VDD pins.

The present disclosure has the following beneficial effects:

When a plurality of LED lamp bead installation areas are on the carrier board, each LED lamp bead installation area is provided with the corresponding VDD power input pin terminal, VSS power input pin terminal, and DIN control terminal, and the plurality of LED lamp bead installation areas are controlled separately to reduce the failure rate, which also increases the overall controllability and diversity of lighting effects. By reducing the DOUT pin terminals in the prior art, the present disclosure increases the area of electrical connection between every two pins, which is conducive to improving the stability of current and the heat dissipation effect of LED lamp beads.

By reducing the DOUT pins connected in series, the present disclosure reduces the complexity of PCB arrangement, makes control more convenient, and reduces the failure rate. By reducing the DOUT pin terminals connected in series, the present disclosure can reduce production costs and development costs of the circuit boards to some extent. The present disclosure controls light-emitting lamp sets through connection in parallel, so that even when one LED lamp bead or one set of LED lamp beads are damaged, other LED lamp beads can still work normally, thus being highly economical.

DETAILED DESCRIPTION OF THE EMBODIMENTS

Figure 1:
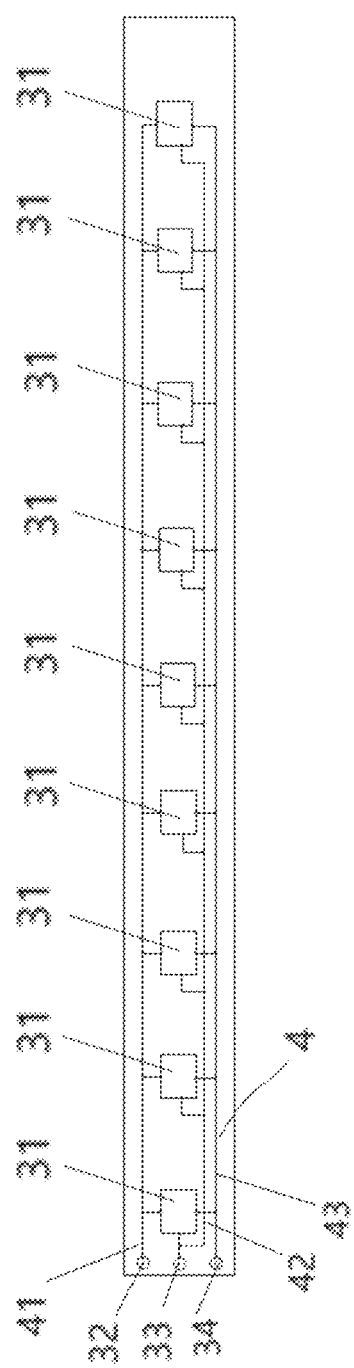
FIG. 1 illustrates a printed circuit board (PCB) arrangement and wiring structure of single-row LED lamp beads according to an embodiment of the present disclosure.

To make objectives, technical solutions and advantages of the present disclosure clearer, the present disclosure will be further described in detail with reference to accompanying drawings and in conjunction with embodiments. It should be understood that the present disclosure is a systematic method for quantifying assessments, and specific embodiments described herein are merely used to explain the present disclosure, and are not used to limit the present disclosure. Further, technical features involved in various embodiments of the present disclosure described below can be combined as long as they do not conflict with each other.

In the prior art, a light-emitting diode (LED) lamp product, such as a LED lamp bead strip, is formed by integrating a plurality of LED lamp beads. All the LED lamp beads are electrically connected in series with each other. Thus, when one of the LED lamp beads is damaged, the entire LED lamp product will not light up, which is always a shortcoming of LED lamp products. Further, in a traditional packaging structure of LED lamp beads, each LED lamp bead has four pins: one DIN pin, one DOUT pin, one VDD pin, and one VSS pin. When all the LED lamp beads are connected in series, signal data of the LED lamp beads need to be transmitted from one LED lamp bead to the next LED lamp bead, so that almost all the LED lamp beads are in a working state, resulting in that power consumption of the LED lamp beads is always high, thereby shortening a service life of the LED lamp beads and even an overall service life of the entire LED lamp product.

Due to miniaturization of LED chips, the adhesion of LED chips needs to be enhanced. In view of current industry pain points, in order to solve the above problems, the present disclosure reduces DOUT pins while increasing a width or length of the VDD pin and a bonding pad. Compared to other products, the present disclosure has a stronger adhesion with less false welding.

Since there is no DOUT pin, the signal data of each lamp bead is independent and does not need to be transmitted from one lamp bead to the next lamp bead, so that when one lamp bead is in an addressing mode, most of the other lamp beads are in a sleeping state. In contrast, almost all traditional lamp beads are in a working state during data transmission, so that an average power consumption of traditional lamp beads remains high, approaching 400 UA. When our current technology is adopted, the average power consumption of lamp beads is as low as 5 UA in most of the time, and energy consumption is reduced as much as possible. Further, data are transmitted faster, and point-to-point transmission is achieved by sending signals directly through a controller.

The present disclosure provides a printed circuit board (PCB) arrangement and wiring structure of LED lamp beads, to solve the problem in the traditional packaging structure of LED lamp beads that when one of the LED lamp beads is damaged, the entire LED lamp product will not light up, and almost all the LED lamp beads are in a working state, thereby shortening an overall service life of the entire LED lamp product. The technical solution of the present disclosure is introduced in detail below.

According to a first aspect of the present disclosure, a PCB arrangement and wiring structure of LED lamp beads is provided, and the structure includes: a carrier board, where at least one set of LED lamp bead installation areas is arranged on the carrier board, at least one set of the LED lamp bead installation area is in a matrix form, the installation area includes a plurality of sets of pins, and each set of the pins includes a VDD pin, a DIN pin, and a VSS pin. All the VDD pins are connected and wired in parallel with each other, and all the VSS pins are connected and wired in parallel with each other, so that the voltage between each set of lamp beads remains consistent; all the DIN pins are connected and wired in parallel with each other, so that the working state of each lamp bead can be separately controlled; the carrier board is further provided with at least one set of VDD power input pin terminals, VSS power input pin terminals, and DIN control terminals, where one VDD power input pin terminal, one VSS power input pin terminal, and one DIN control terminal constitute one set, a plurality of the VDD pins are electrically connected to the VDD power input pin terminal, a plurality of the VSS pins are electrically connected to the VDD power input pin terminal, and a plurality of the DIN pins are electrically connected to the DIN control terminal; and the VDD power input pin terminal, the VSS power input pin terminal, and the DIN control terminal are arranged on a side or a back face of the LED lamp bead installation area.

With reference to FIG. 1, FIGS. 1-6 illustrate a PCB arrangement and wiring structure of LED lamp beads according to a first embodiment of the present disclosure. The PCB arrangement and wiring structure includes a carrier board, N sets of pins are arranged in a LED lamp bead installation area of the carrier board, and each set of pins include a VDD pin, a DIN pin, and a VSS pin.

As shown in FIG. 1, a row of lamp beads can be installed in the LED lamp bead installation area, without limitation to the number of lamp beads. Each lamp bead corresponds to a set of pins, and the set of pins includes one VDD pin, one DIN pin, and one VSS pin. All the VDD pins are connected in parallel with each other, all the DIN pins are connected in parallel with each other, and all the VSS pins are also connected in parallel with each other. The benefit of connecting all the DIN pins in parallel with each other lies in that even if one lamp bead is damaged, other lamp beads will not be affected in voltage change, thus avoiding other failures. Specifically, all the VDD pins are wired in parallel with each other, and all the VSS pins are wired in parallel with each other, so that the voltage between each set of lamp beads remains consistent; and all the DIN pins are connected and wired in parallel with each other, so that the working state of each lamp bead (such as an on state, an off state, a color change state, and a brightness change state) can be separately controlled.

As shown in FIG. 1, the carrier board is further provided with a set of VDD power input pin terminals, VSS power input pin terminals, and DIN control terminals, where one VDD power input pin terminal, one VSS power input pin terminal, and one DIN control terminal constitute one set, a plurality of the VDD pins are electrically connected to the VDD power input pin terminal, a plurality of the VSS pins are electrically connected to the VDD power input pin terminal, and a plurality of the DIN pins are electrically connected to the DIN control terminal; and the VDD power input pin terminal, the VSS power input pin terminal, and the DIN control terminal are arranged on a side or a back face of the LED lamp bead installation area.

In this embodiment, as shown in FIG. 1, the PCB arrangement and wiring structure can be a wiring structure formed by a plurality of lamp beads in a single row, and one power supply 1, one controller 2, and one row of lamp bead sets 3 are arranged on the carrier board. One VDD power input pin terminal 32, one DIN control terminal 33, and one VSS power input pin terminal 34 are arranged on the carrier board. As defined, one VDD power input pin terminal, one DIN control terminal, and one VSS power input pin terminal constitute one set of pin terminals. A plurality of sets of pin terminals can be arranged on a back face or a side of the carrier board.

In this embodiment, a shared power line VDD41 is drawn from the VDD power input pin terminal; a shared signal input line DIN42 is drawn from the DIN control terminal; a shared ground line VSS43 is drawn from the VSS power input pin term, and a row of lamp bead sets 3 may include two, four, five, or more LED lamp beads 31.

Further with reference to FIG. 1, the shared power line VDD41, the shared signal input line DIN42, and the shared ground line VSS43 are parallel to each other and laid along a length direction of the carrier board 4. Each LED lamp bead set includes a plurality of LED lamp beads, each lamp bead is provided with a VDD pin, a DIN pin, and a VSS pin. The LED lamp beads are arranged between the shared power line VDD and the shared signal input line DIN, or between the shared power line VDD and the shared ground line VSS, or between the shared signal input line DIN and the shared ground line VSS.

In this embodiment, the VDD pins of each LED lamp bead are electrically connected to the shared power line VDD respectively in a corresponding manner; the DIN pins of each LED lamp bead are respectively connected to the shared signal input line DIN respectively in a corresponding manner; the VSS pins of each LED lamp bead are electrically connected to the shared ground line VSS respectively in a corresponding manner; the VDD power input pin terminal is electrically connected to a positive electrode of the power supply; the DIN control terminal is connected to the controller; and the VSS power input pin terminal is electrically connected to a negative electrode of the power supply.

In this embodiment, the VDD power input pin terminal, the DIN control terminal, and the VSS power input pin terminal are located at an end of the carrier board and spaced apart from each other along a width direction of the carrier board. As shown in FIG. 1, the VDD power input pin terminal, the DIN control terminal, and the VSS power input pin terminal are sequentially arranged from top to bottom. Of course, the order is adjusted according to actual needs, and no limitation is made herein.

In this embodiment, a positive electrode bonding pad of power supply and a negative electrode bonding pad of power supply are arranged on a side of the carrier board, and configured for electrically connecting the power supply to the carrier board. The power supply 1, the controller 2, and the lamp bead set 3 are mounted on the carrier board.

Figure 2:
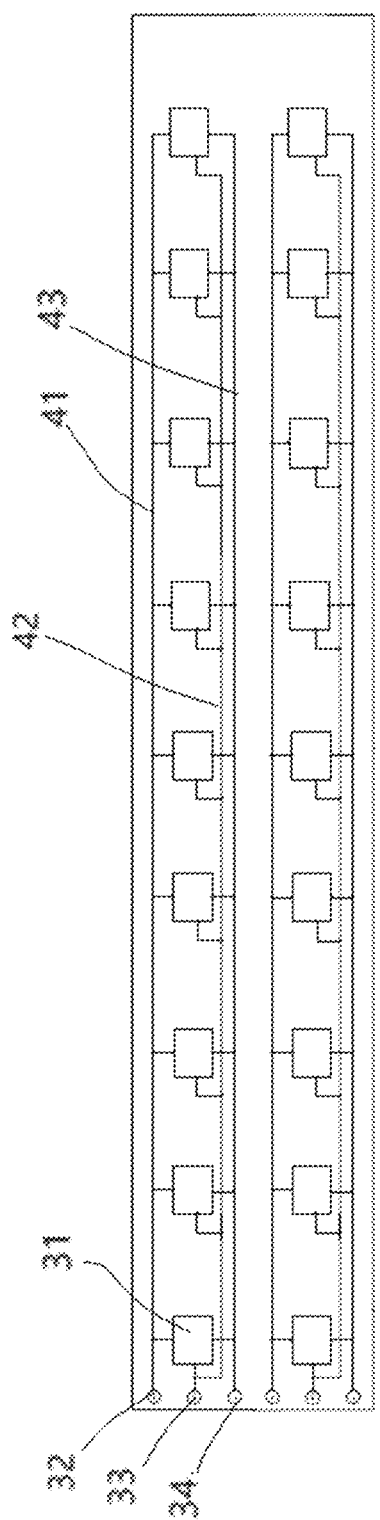
FIG. 2 illustrates a PCB arrangement and wiring structure of multi-row LED lamp beads according to an embodiment of the present disclosure.
Figure 3:
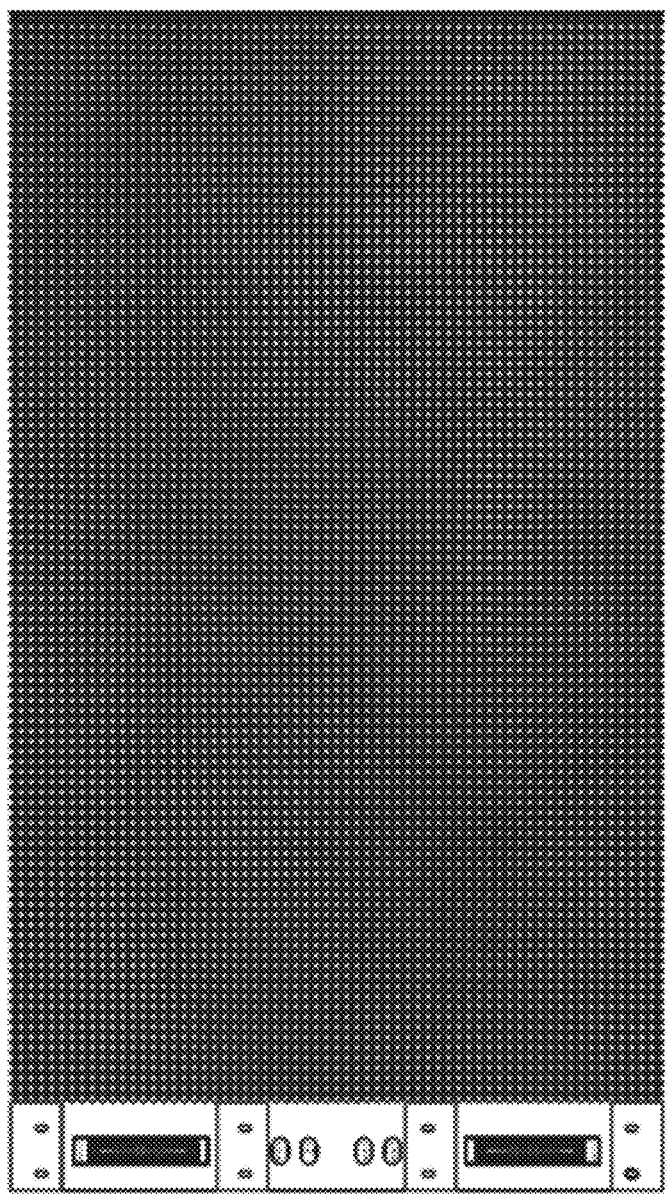
FIG. 3 is an effect diagram of a PCB arrangement and wiring structure of multi-row LED lamp beads according to an embodiment of the present disclosure.

In this embodiment, the PCB arrangement and wiring structure can be a wiring structure formed by a plurality of lamp beads in a plurality of rows. As shown in FIG. 2, two power supplies, two controllers, and two rows of lamp bead sets are arranged on the carrier board. Two sets of pin terminals with one above the other, i.e., two VDD power input pin terminals, two DIN control terminals, and two VSS power input pin terminals, are arranged on the carrier board. It should be noted that two sets of bonding pads are symmetrically located at an end of the carrier board and spaced apart from each other along the width direction of the carrier board. Each row of lamp bead sets 3 are independently connected to one controller and one power supply, or each lamp bead set 3 is respectively connected to two power supplies and two controllers in a connection manner for the wiring structure formed by a plurality of lamp beads in a single row. Use of dual power supplies and dual controllers effectively increases an operating load, makes control more convenient, and achieves different lighting effects, while reducing a failure rate. FIG. 3 is an effect diagram of a PCB arrangement and wiring structure.

Figure 4:
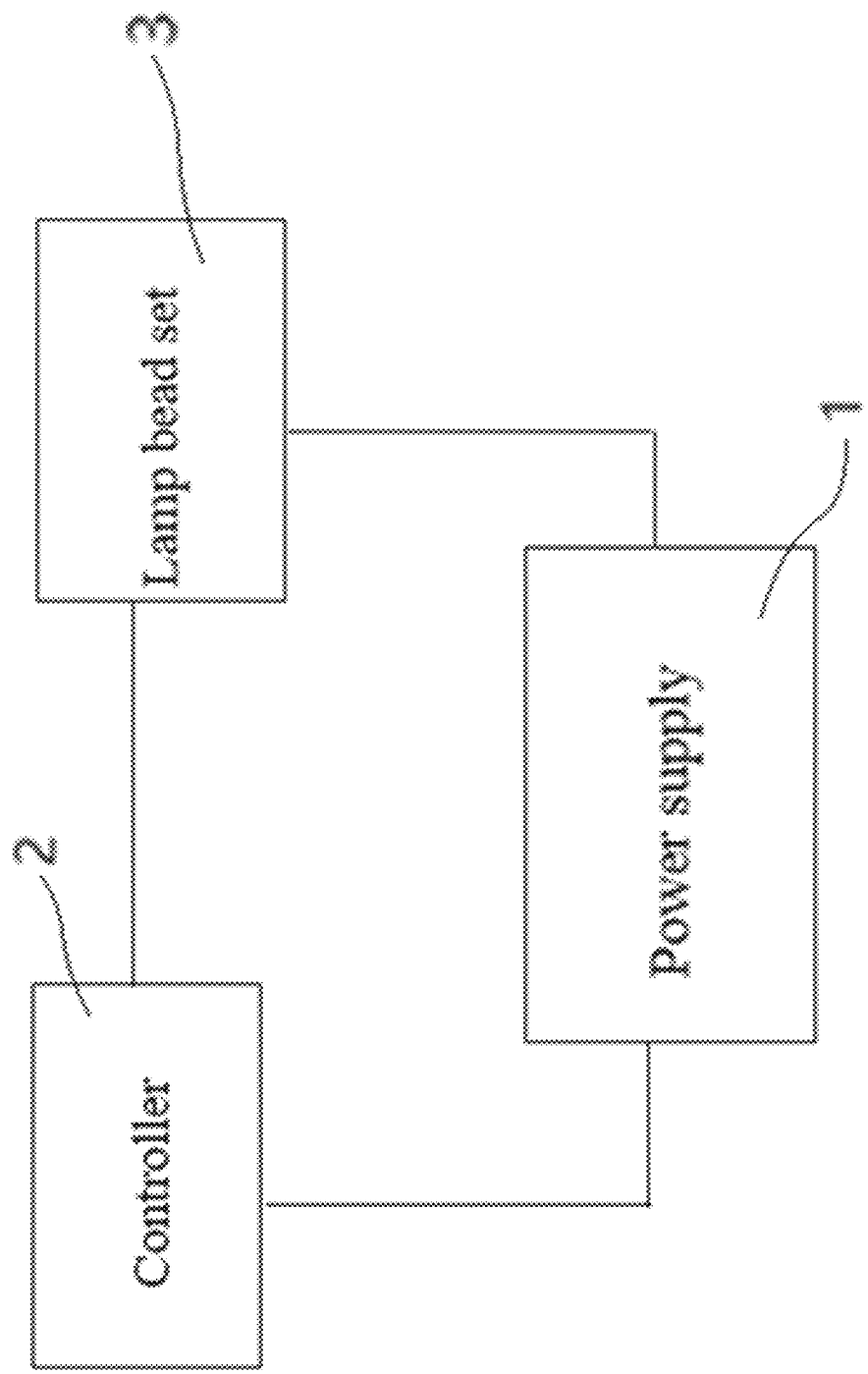
FIG. 4 is a schematic diagram illustrating the working principle of a PCB arrangement and wiring structure of LED lamp beads according to an embodiment of the present disclosure.
Figure 5:
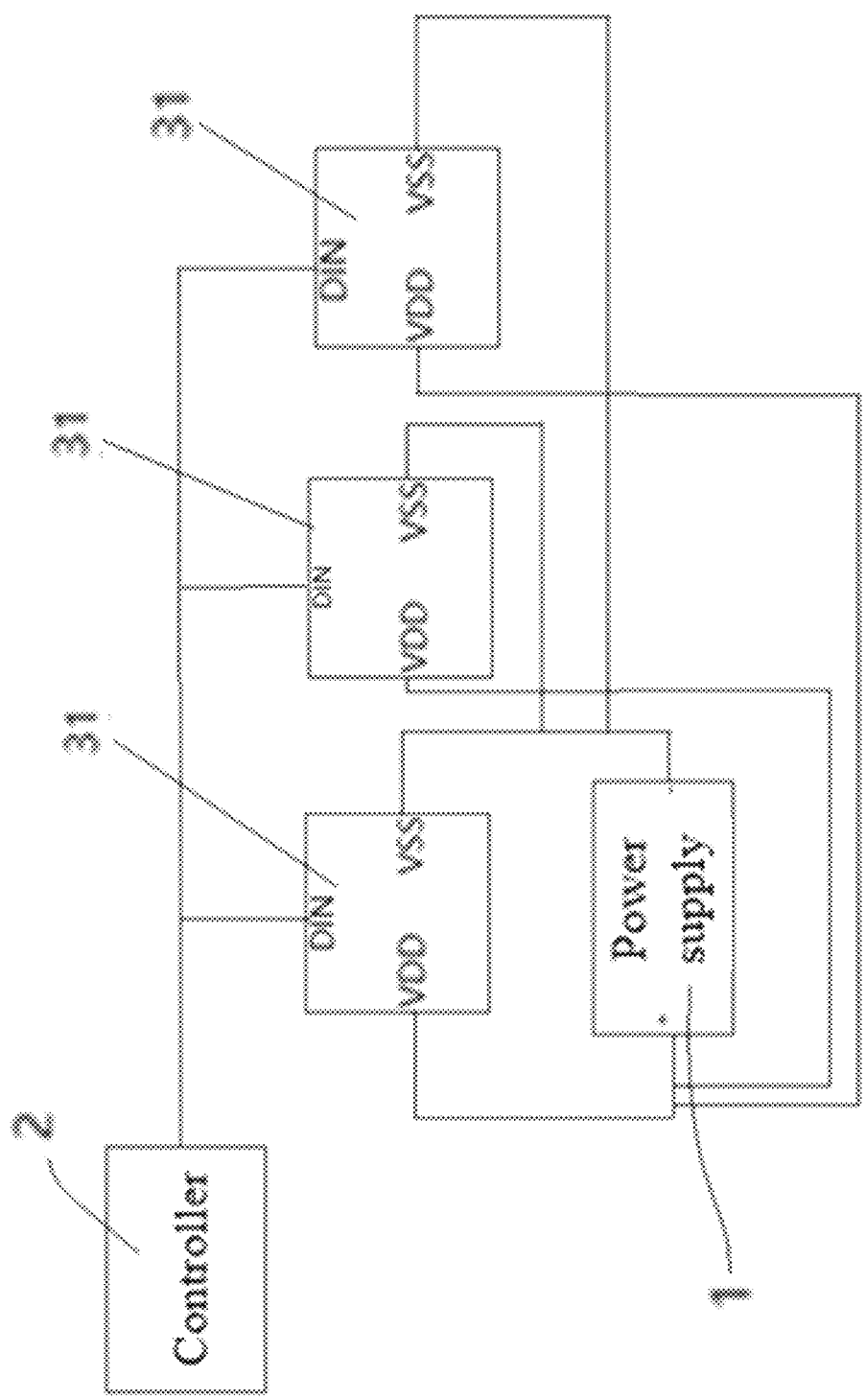
FIG. 5 is a schematic diagram of connection of LED lamp beads with a power supply and a controller according to an embodiment of the present disclosure.
Figure 6:
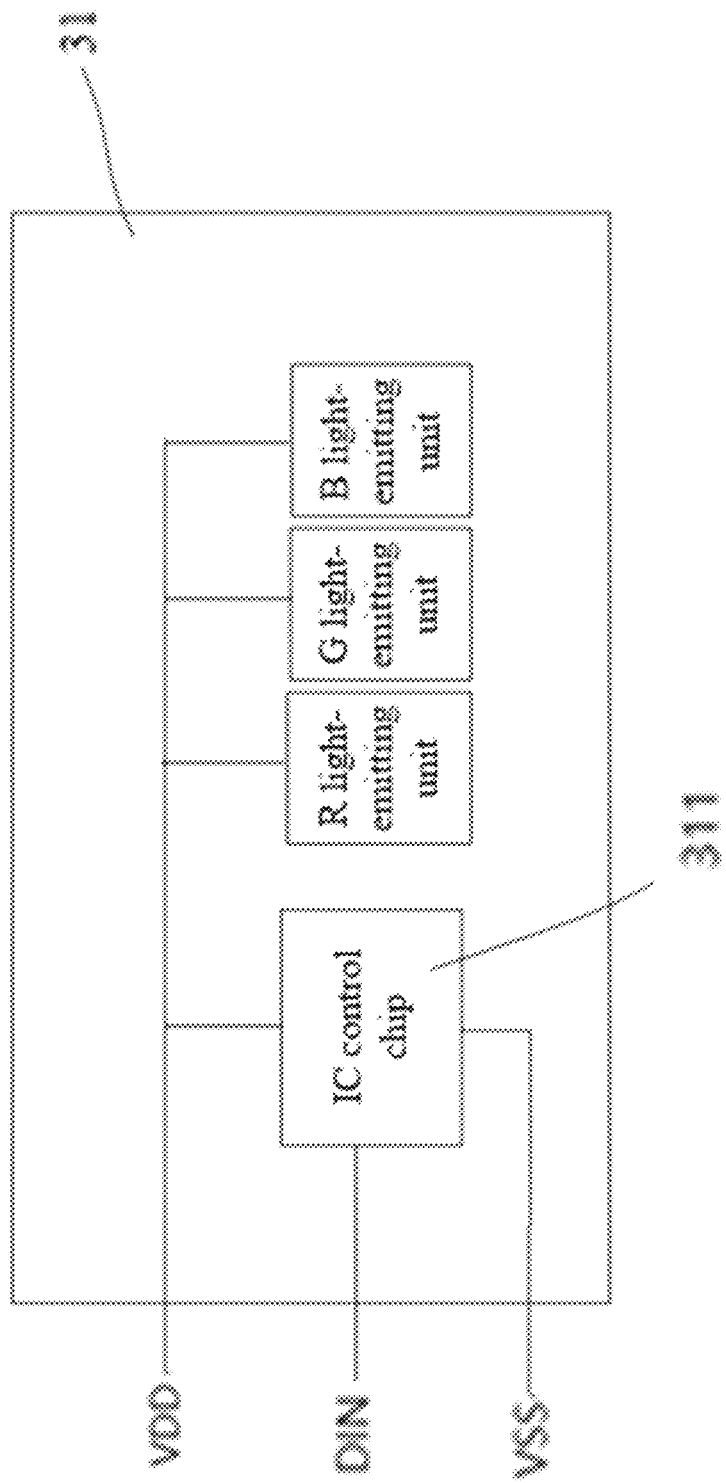
FIG. 6 is a structural schematic diagram of a LED lamp bead according to an embodiment of the present disclosure.

In this embodiment, as shown in FIGS. 4-6, each of the LED lamp beads 31 is connected to a DIN pin, a VDD pin, and a VSS pin, all DIN pins of the LED lamp beads are electrically connected to the controller 2, and all DIN pins of the LED lamp beads are connected in parallel with each other. All VDD pins of the LED lamp beads are electrically connected to the positive electrode of the power supply 1, and all VDD pins of the LED lamp beads are connected in parallel with each other. All VSS pins of the LED lamp beads are electrically connected to the negative electrode of the power supply 1, and all VSS pins of the LED lamp beads are connected in parallel with each other.

As shown in FIG. 6, each LED lamp bead 31 is provided with an IC control chip 311 and a plurality of monochromatic light-emitting units, where the plurality of monochromatic light-emitting units include a R light-emitting unit, a G light-emitting unit, and a B light-emitting unit, respectively, and the plurality of monochromatic light-emitting units are all electrically connected to the VDD pins, and further electrically connected to the positive electrode of the power supply 1 through the VDD pins.

The IC control chip 311 stores a unique address code of each LED lamp bead 31. For example, the address code of a first LED lamp bead 31 is 001, and the address code of a second LED lamp bead 31 is 002, and so on. The lamp bead strip can selectively light up any LED lamp bead, so that even when any LED lamp bead is damaged, the lamp bead strips of other LED lamp beads can still work normally.

The present disclosure achieves parallel control of all the LED lamp beads 31, so that even when one LED lamp bead or one set of LED lamp beads are damaged, other LED lamp beads can still work normally, so that the present disclosure is highly economical. By eliminating the DOUT pins connected in series in the traditional packaging structure of LED lamp beads, the present disclosure makes signal data of each LED lamp bead become independent, without need to transmit data from one LED lamp bead 31 to the next LED lamp bead 31, so that when each LED lamp bead 31 is in an addressing mode, most of the other lamp beads 31 are in a sleeping state.

However, all the LED lamp beads 31 in the traditional packaging structure are almost always in the working state during data transmission, so that power consumption of the LED lamp beads 31 is relatively high, approaching 400 µA. The present disclosure allows the LED lamp beads 31 to work in a state of power consumption of less than 5 µA for most of the time, thereby effectively reducing energy consumption. Therefore, the present disclosure reduces the heat generated by loads of the LED lamp beads 31, which is conducive to extending the service life of the LED lamp beads 31 and correspondingly extending the service life of the LED lamp product.

Due to elimination of the DOUT pins in the present disclosure, after all new LED lamp beads 31 are packaged, the LED lamp product can be ultimately optimized with a simplified circuit design through reasonable size/screen reduction or wiring of the LED lamp beads 31. Further, the present disclosure achieves point-to-point transmission by directly transmitting signals through the controller, so that data transmission is faster.

In this embodiment, the problem of sorting the LED lamp beads can also be solved. In this embodiment, only an encoded address in a register needs to be called to control the LED lamp beads, without need to take into account an address code of the LED lamp beads, which avoids the trouble of sorting the LED lamp beads, thereby improving the efficiency of assembling the LED lamp bead strips (hardware), and improving the convenience of software programming due to unnecessity of taking into account the address code of the LED lamp beads.

Since a very small IC control chip is integrated in each LED lamp bead, and the sequence code or ID address of the IC control chip in each LED lamp bead is different, that is, the IC control chip stores a unique address code, and the controller controls the LED lamp beads in brightness (on/off), color and the like through addressing. To form a point-controlled LED lamp bead strip, all the LED lamp beads need to be sequentially assembled based on their unique address codes. However, it is very inefficient when assembling hundreds or thousands of LED lamp beads, and it is usually difficult to find out the LED lamp bead assembled wrongly during product inspection.

To overcome the above defects, the controller of the present disclosure is provided with a plurality of address registers, the address registers are in one-to-one correspondence with the LED lamp beads, and the address codes of the LED lamp beads are collected in an order of connecting and arranging the LED lamp beads in the lamp bead strip. The corresponding address codes of LED lamp beads are stored in the address registers, and continuous addresses available make it easy to locate a LED lamp bead corresponding to an address register. A final product of point-controlled LED lamp bead strip is formed by connecting the LED lamp beads in series or in parallel randomly according to their address codes. In this way, the lamp bead strips can be assembled freely without need to take into account the order of sorting the LED lamp beads.

Each LED lamp bead 31 includes an IC control chip 311 and a light-emitting diode connected to the IC control chip 311, and the light-emitting diode can be a monochromic light-emitting diode or a red-green-blue (RGB) light-emitting diode. The IC control chip 311 is provided with a read-only memory (ROM) for storing the address code, and the ROM stores a unique 8-bit address code representing the LED lamp bead 31. Different address codes of various sizes can be applied to different application scenarios. For example, an 8-bit address code corresponds to a lamp bead strip of 255 LED lamp beads 31. Optionally, a 16-bit address code can be applied to a lamp bead strip of over a thousand LED lamp beads 31, and a 4-bit address code can be used for a smaller application scenario. The IC control chip can be a single chip, the single chip is connected to the power supply 1, the power supply 1 supplies power to the single chip and the LED lamp beads 31, and the IC control chip 311 and the controller 2 are in serial communication with each other through the power supply 1. Time of addressing by the controller 2 is very short, generally 10-50 ms, so that the flicker is not perceptible to human eyes. Through the power supply 1, the controller 2 can supply power to the LED lamp beads 31 and control a particular LED lamp bead 31 separately.

The controller is provided with a microprocessor, a programmable ROM, an output interface, and an address register. Specifically, the controller 2 is provided with a bus, and the bus is connected to the microprocessor, the programmable ROM, the output interface, and the address register. The output interface is connected to the power supply, and the address register is an 8-bit non-volatile data memory. The address code is stored in a corresponding address register in a stacked manner, and the address codes in the address registers are consecutively sorted in order, generally in an order from low to high. For example, the first address register corresponds to the first LED lamp bead 31, and the second address register corresponds to the second LED lamp bead 31. The microprocessor executes a program stored in the programmable ROM, and the program is a program that controls the display of various light patterns for the LED lamp bead set 3. A programmer can directly program according to the address code stored in the address register without need to take into account the address code of the corresponding LED lamp bead 31 in the LED lamp bead set 3. The microprocessor in the working state, according to a preset program in the ROM, controls the power output interface to continuously output a level signal (such as a high-level signal) to supply power for the LED lamp beads, or outputs a level signal according to the address code stored in the address register to control the corresponding LED lamp bead 31.

Based on the PCB arrangement and wiring structure of the present disclosure, point control of the LED lamp bead sets can be achieved. Manufacturing steps are as follows: first, manufacturing the LED lamp beads 31, writing address codes of the LED lamp beads 31 through the IC control chips 311, then connecting the IC control chip 311 to the light-emitting diode to form an LED lamp bead 31 with a unique address code, and randomly connecting the LED lamp beads 31 in series or in parallel according to the address codes sorted disorderly to form a lamp bead set 3;

making a controller 21 with a plurality of address registers, and connecting the lamp bead set 3 to a power output interface; and using a conventional address code acquisition tool to sequentially collect the address codes of the LED lamp beads 31 according to the order of connecting and arranging the LED lamp beads 31 in the lamp bead set 3, collecting the address codes of all the LED lamp beads 31 in the lamp bead set 3 from the first one and storing them in a mobile phone, a computer or any other storage device, then writing the address codes in the storage device into the address register of the controller 21 in a stacked manner, and storing the corresponding address codes of the LED lamp beads 31 in the address registers sequentially arranged, where the address registers are in one-to-one correspondence with the LED lamp beads 31. To speed up the acquisition speed, a plurality of acquisition heads can be used simultaneously. For example, eight acquisition heads constituting a group can be used for simultaneous acquisition.

Through use of separate DIN pins and matching controllers, the LED lamp beads of the present disclosure can be used in various application scenarios, such as lamp bead strips, LED lamp bead strips, advertising lamp boxes, advertising screens, or display screens, and can also display different patterns or colors, which are very functional.

To sum up, according to the PCB arrangement and wiring structure of the present disclosure, the DOUT pins connected in series are eliminated, and sizes of the VDD pins, the VSS pins, and the DIN pins can be correspondingly increased, so that an electrical connection is more secure, operation is more stable, and resistance can be reduced. Due to elimination of the DOUT pins in the present disclosure, after all new LED lamp beads 31 are packaged, the LED lamp product can be ultimately optimized with a simplified circuit design through reasonable size/screen reduction or wiring of the LED lamp beads 31. Further, the present disclosure achieves point-to-point transmission by directly transmitting signals through the controller, so that data transmission is faster.

The PCB arrangement and wiring structure, the lamp beads and the lamp bead strips, without need to take into account the order of sorting the LED lamp beads, can be assembled randomly. Further, a controller is arranged, and the controller is provided with the address registers in one-to-one correspondence with the LED lamp beads. Only an encoded address in a register needs to be called to control the LED lamp beads, without need to take into account an address code of the LED lamp beads, which avoids the trouble of sorting the LED lamp beads, thereby improving the efficiency of assembling the LED lamp bead strips, and improving the convenience of software programming due to unnecessity of taking into account the address code of the LED lamp beads.

Finally, it should be noted that the above embodiments are only used to illustrate the technical solutions of the present disclosure, but not to limit them; although the present disclosure has been described in detail with reference to the foregoing embodiments, those ordinarily skilled in the art should understand that: the technical solutions described in the foregoing embodiments can still be modified, or some technical features thereof can be equivalently replaced; and these modifications or replacements do not make the essence of the corresponding technical solutions deviate from the spirit and scope of the technical solutions of the embodiments of the present invention.

What is claimed is:

1. A PCB arrangement and wiring structure of LED lamp beads, comprising:

a carrier board, wherein at least one set of LED lamp bead installation areas is arranged on the carrier board, at least one set of the LED lamp bead installation area is in a matrix form, the installation area comprises a plurality of sets of pins, and each set of the pins comprises a VDD pin, a DIN pin, and a VSS pin;

all the VDD pins are connected and wired in parallel with each other, and all the VSS pins are connected and wired in parallel with each other, so that the voltage between each set of lamp beads remains consistent;

all the DIN pins are connected and wired in parallel with each other, so that the working state of each lamp bead can be separately controlled;

the carrier board is further provided with at least one set of VDD power input pin terminals, VSS power input pin terminals, and DIN control terminals, where one VDD power input pin terminal, one VSS power input pin terminal, and one DIN control terminal constitute one set, a plurality of the VDD pins are electrically connected to the VDD power input pin terminal, a plurality of the VSS pins are electrically connected to the VDD power input pin terminal, and a plurality of the DIN pins are electrically connected to the DIN control terminal; and the VDD power input pin terminal, the VSS power input pin terminal, and the DIN control terminal are arranged on a side or a back face of the LED lamp bead installation area.

2. The PCB arrangement and wiring structure of LED lamp beads according to claim 1, wherein the LED lamp bead installation area is configured for installing LED lamp bead sets; and each LED lamp bead set comprises a plurality of LED lamp beads; and each LED lamp bead is electrically connected to one VDD pin, one DIN pin, and one VSS pin.

3. The PCB arrangement and wiring structure of LED lamp beads according to claim 1, wherein a shared power line VDD is drawn from each of the VDD power input pin terminals;

a shared signal input line DIN is drawn from each of the DIN control terminals;

a shared ground line VSS is drawn from each of the VSS power input pin terminals; and the VDD pins of each LED lamp bead are electrically connected to the shared power line VDD respectively in a corresponding manner; the DIN pins of each LED lamp bead are respectively connected to the shared signal input line DIN respectively in a corresponding manner; and the VSS pins of each LED lamp bead are electrically connected to the shared ground line VSS respectively in a corresponding manner.

4. The PCB arrangement and wiring structure of LED lamp beads according to claim 1, wherein
the VDD power input pin terminal is electrically connected to a positive electrode of the power supply;
the DIN control terminal is connected to the controller; and
the VSS power input pin terminal is electrically connected to a negative electrode of the power supply.

5. The PCB arrangement and wiring structure of LED lamp beads according to claim 3, wherein
the shared power line VDD, the shared signal input line DIN, and the shared ground line VSS are laid along a length direction of the carrier board, and the LED lamp beads are arranged along directions of the shared power line VDD, the shared signal input line DIN and the shared ground line VSS at an equal interval.

6. The PCB arrangement and wiring structure of LED lamp beads according to claim 1, wherein
the VDD power input pin terminal, the DIN control terminal, and the VSS power input pin terminal are located at an end of the carrier board and spaced apart from each other along a width direction of the carrier board.

7. The PCB arrangement and wiring structure of LED lamp beads according to claim 1, wherein
a positive electrode bonding pad of power supply and a negative electrode bonding pad of power supply are arranged on a side of the carrier board, and configured for electrically connecting the power supply to the carrier board.

8. The PCB arrangement and wiring structure of LED lamp beads according to claim 1, wherein a wiring length and width of each of the shared power lines VDD, the shared signal input lines DIN, and the shared ground lines VSS are set according to the size of the carrier board, and the lamp beads are located in an area between any two of the shared power line VDD, the shared signal input line DIN, and the shared ground line VSS.

9. The PCB arrangement and wiring structure of LED lamp beads according to claim 1, wherein the carrier board is a PCB circuit board.

10. The PCB arrangement and wiring structure of LED lamp beads according to claim 2, wherein
each LED lamp bead is provided with an IC control chip and a plurality of monochromatic light-emitting units, the IC control chip stores a unique address code of each LED lamp bead, the IC control chip is connected to a positive electrode and a negative electrode of the power supply respectively through a VDD pin and a VSS pin, the IC control chip is connected to the controller through a DIN pin, and the plurality of monochromatic light-emitting units are connected to the positive electrode of the power supply through VDD pins; and the plurality of monochromatic light-emitting units include a R light-emitting unit, a G light-emitting unit, and a B light-emitting unit, and the plurality of monochromatic light-emitting units are all electrically connected to the VDD pins.

\* \* \* \* \*